United States Patent [19]
Lenz et al.

[11] Patent Number: 5,534,751
[45] Date of Patent: Jul. 9, 1996

[54] PLASMA ETCHING APPARATUS UTILIZING PLASMA CONFINEMENT

[75] Inventors: Eric H. Lenz, San Jose; Robert D. Dible, Fremont, both of Calif.

[73] Assignee: Lam Research Corporation, Fremont, Calif.

[21] Appl. No.: 500,196

[22] Filed: Jul. 10, 1995

[51] Int. Cl.$^6$ ............................................. H01J 7/24
[52] U.S. Cl. ............................. 315/111.71; 315/111.21; 315/111.91; 156/345
[58] Field of Search ............................ 315/111.71, 111.21, 315/111.91; 156/345; 204/298, 240, 308, 164

[56] References Cited

U.S. PATENT DOCUMENTS

| | | | |
|---|---|---|---|
| 4,464,223 | 8/1984 | Gorin | 156/643 |
| 4,491,496 | 1/1985 | Laporte et al. | 156/345 |
| 4,534,816 | 8/1985 | Chen et al. | 156/345 |
| 4,579,618 | 4/1986 | Celestino et al. | 156/345 |
| 4,585,516 | 4/1986 | Corn | 156/643 |
| 4,617,079 | 10/1986 | Tracy et al. | 156/345 |
| 4,863,549 | 9/1989 | Grunwald | 156/345 |
| 4,889,588 | 12/1989 | Fior | 156/643 |
| 5,032,202 | 7/1991 | Tsai et al. | 315/111.71 X |
| 5,057,185 | 10/1991 | Thomas, III et al. | 156/643 |
| 5,110,438 | 5/1992 | Ohmi et al. | 204/298.34 |
| 5,272,417 | 12/1993 | Ohmi | 315/111.21 |
| 5,413,673 | 5/1995 | Fujimoto | 156/345 |
| B14,464,223 | 4/1991 | Gorin | 156/643 |

*Primary Examiner*—Robert Pascal
*Assistant Examiner*—Haissa Philogene
*Attorney, Agent, or Firm*—Irwin Ostroff; Arthur J. Torsiglieri

[57] ABSTRACT

Plasma etching apparatus includes a stack of quartz rings that are spaced apart to form slots therebetween and that are positioned to surround an interaction space between two electrodes of the apparatus where a plasma is formed during operation of the apparatus. The dimensions of the slots are chosen to insure that charged particles of spent gases in the plasma exiting the interaction space are neutralized by wall collisions as they exit the slots. Two voltage sources of different frequencies are used to apply voltages to the electrodes in a fashion that isolates each source from the other.

30 Claims, 2 Drawing Sheets

PLASMA ETCHING APPARATUS UTILIZING PLASMA CONFINEMENT

FIELD OF THE INVENTION

This invention relates to plasma etching apparatus, and more particularly, to a plasma etching apparatus that includes provision for confining the plasma essentially to a region of width commensurate with the width of a workpiece (e.g., semiconductive wafer) to be etched.

BACKGROUND OF THE INVENTION

Plasma etching has become the preferred technique for etching patterns in the various layers utilized in the manufacture of integrated circuit devices. The apparatus for such etching typically includes a chamber housing a pair of essentially planar electrodes that are spaced apart in a parallel relationship to define an interaction space therebetween. On a first of the electrodes is positioned a semiconductive wafer being processed. For such processing, an appropriate gaseous medium is introduced into the chamber and then one or more suitable high radio-frequency voltages are impressed across the pair of electrodes to generate a discharge and form a plasma that etches suitably exposed regions of the wafer.

It has become of increasing importance both for efficiency and for uniformity to confine the plasma essentially to the interaction space between the two electrodes. To this end, it has been proposed to include a ring-shaped element (a confining element or member) of a dielectric material at the periphery of one or both of the electrodes to confine the discharge to the interaction space (e.g., see U.S. Pat. No. 5,413,675 that issued on May 9, 1995). Alternatively, it has been known to include a cylindrical anodized aluminum shield to enclose the interaction space between the two electrodes with holes being provided in the shield to permit egress of the spent gases from the enclosed interaction space. This conductive shield is typically electrically connected to one of the electrodes which is connected to ground potential. This shield serves to effectively bring ground potential close to the other electrode. This tends to confine the discharge to the interaction space between the electrodes since any charged particles of the discharge will be quickly brought to ground potential upon making contact with the shield.

It is important to control the residence time the gases are within the interaction space between the two electrodes during processing of a workpiece. Historically, fast gas flow and low residence times have tended to give rise to discharges outside the space enclosed by the confining members (elements). This reduces the controllability of the operation and also may result in an undesirable formation of various deposits on the walls of the etching chamber.

For modern device geometries and dimensions, it is desirable to have plasma etching apparatus in which the discharge is maintained within the interaction space and in which the gases used can be relatively quickly passed through the apparatus so as to enhance control of etch parameters such as profile control and etch selectivity. This reduces the time for processing and thus reduces the over all cost of the integrated circuits being produced on the semiconductor wafers. In addition, it limits undesirable deposits from forming on walls of the etching chamber.

SUMMARY OF THE INVENTION

We have discovered that an important factor for the undesired discharge outside the interaction space is that enough of the gas exiting out of the interaction space consists of ionized gas particles carrying an electric charge and that if provision is made to neutralize such charge as the spent gas exits from the interaction space, the tendency for discharges to extend outside the interaction space is effectively reduced.

To this end, the present invention involves confining the plasma discharge to the interaction space between the electrodes by surrounding the interaction space with confinement assembly defining a plurality of passages extending through the confinement assembly from an inner to an outer surface, the passages being proportioned to neutralize charged particles created in the plasma when the charge particles pass through the passages. In the limit, the confinement assembly may consist of a single dielectric ring centered to form two distinct parallel slots, one above and one below it. In the more usual case, the confinement assembly comprises a stack of at least three dielectric rings that are spaced apart in a manner essentially to form a circular cylinder having at least a pair of circumferential slots (passages, openings) in addition to the slots above and below. In a typical embodiment, six rings were used to form five distinct parallel circumferential slots therebetween in addition to the slots above and below. Moreover, the slots that are formed are appropriately proportioned such that the distance a charged gas particle from the plasma must travel in a slot in exiting is substantially longer than the mean-free path of the particle so that most exiting particles make at least one collision with the walls of the slot. These collisions with the slot walls neutralize the charges on the particles and so the exiting particles are neutral. Accordingly, the tendency for a discharge outside the interaction space is essentially eliminated.

In addition to confining the plasma, the cylindrical confinement assembly formed by the stack of rings also serves to confine the coating by the polymers that tend to form in the plasma etching processes to only the confinement rings themselves and not to the inside walls of the chamber. Because the confinement assembly becomes coated, it is important that the shield be of a design that is easily disassembled, easily cleaned and easily replaced. The use of rings for the confinement assembly satisfies these conditions.

Moreover, the inclusion of the confinement assembly can reduce the customary role of the housing or chamber walls as a return or ground for any radio-frequency source used to generate the plasma. As a consequence, this design makes the apparatus especially amenable to multiple frequency operation. In this type of operation, a relatively low first frequency voltage is applied to the first electrode that supports the workpiece (e.g., a semiconductor wafer) and a second relatively higher frequency voltage is applied to the second electrode. Advantageously, the low frequency voltage source has its return to ground via a low-pass path and the high frequency voltage source has its return to ground via a high-pass path. This results in the two sources being effectively electrically isolated from one another. The preferred embodiment of the present invention uses both the confinement assembly and the two-frequency mode of operation, although each feature can be used independent of the other.

In particular, it is believed that the particular choice of the two frequencies, about 2 megahertz for the frequency of the voltage applied to the electrode supporting the workpiece which frequency is less than the ion transit frequency, and about 27.12 megahertz, which is more than ten times the first frequency (2 megahertz), for the frequency applied to the other electrode forms a separate feature of our invention.

Viewed from one aspect, the present invention is directed to plasma processing apparatus which confines a plasma formed therein to a interaction space between two parallel electrodes thereof. The plasma processing apparatus comprises means for housing a gaseous medium that is useful for processing a workpiece, the two electrodes, and a confinement assembly. The parallel pair of electrodes define therebetween an interaction space where a plasma capable of processing a workpiece supported on one of the electrodes is generated when radio-frequency energy is provided for establishing a discharge between the electrodes and ionizing a gaseous medium. The confinement assembly defines a plurality of separate parallel passages that allow gas flow through the confinement assembly from an inner surface to an outer surface.

The parallel passages are spaced apart in a direction normal to that of the flow of gases through the passages. The confinement assembly is disposed between the electrodes, and the passages are proportioned for essentially confining the discharge within the interaction space by neutralizing charged particles created in the plasma when the charged particles pass through the passages.

Viewed from another aspect, the present invention is directed to plasma etching apparatus that includes plasma confinement. The plasma etching apparatus comprises means for housing a gaseous medium useful for etching, a parallel pair of electrodes, and a stack of at least three spaced apart rings. The electrodes define therebetween an interaction space where a plasma capable of etching a workpiece supported on one of the electrodes is generated when radio-frequency energy is provided for establishing a discharge between the electrodes for ionizing the gaseous medium. The stack of rings, which are spaced apart from each other to form slots therebetween and are positioned to surround the interaction space, control the exit of spent gases for neutralizing charged particles as they exit the interaction space so as to confine the discharge essentially to the interaction space.

Viewed from still another aspect, the present invention is directed to plasma etching apparatus that uses two voltages of different frequencies. The plasma etching apparatus comprises means for housing a gaseous medium useful for etching, a parallel pair of electrodes, a first radio-frequency voltage source having a frequency less than the ion transit frequency and a second radio-frequency voltage source having a frequency at least greater than ten times the first frequency. The parallel pair of electrodes define therebetween an interaction space where a plasma capable of etching a workpiece supported on the first of the electrodes is generated when radio-frequency energy is provided for establishing a discharge between the electrodes for ionizing the gaseous medium to form ions characterized by an ion transit frequency. The first source is coupled to the first electrode by way of an impedance-matching circuit and to a ground return thereof by way of a low-pass filter. The second radio-frequency voltage source is coupled to the second electrode by way of a matching circuit and to a ground return thereof by way of a high-pass filter.

Viewed from still another aspect, the present invention is directed to plasma etching apparatus that includes both plasma confinement and two-frequency operation. The plasma etching apparatus comprises means for housing a gaseous medium useful for etching, a parallel pair of electrodes, a stack of at least three spaced apart rings, a first radio-frequency voltage source having a frequency in the range of about 1.5 to 2.5 megahertz, and a second radio-frequency voltages sources having a frequency in the range of about 25 to 30 megahertz. The parallel pair of electrodes define therebetween an interaction space where a plasma capable of etching a workpiece supported on one of the electrodes is generated when radio-frequency energy is provided for establishing a discharge between the electrodes for ionizing the gaseous medium. The stack of rings, which are spaced apart from each other to form slots therebetween and are positioned to surround the interaction space, control the exit of spent gases and neutralize charged particles as they exit the interaction space so as to confine the discharge essentially to the interaction space. The first source is of lower power than the second source and is coupled to the first electrode by way of an impedance-matching circuit and to a ground return thereof by way of a low-pass filter. The second radio-frequency voltage source being coupled to the second electrode by way of a matching circuit and to a ground return thereof by way of a high-pass filter.

Viewed from still another aspect, the present invention is directed to a confinement assembly for confining a discharge within an interaction space of a plasma processing apparatus containing a gaseous medium useful for processing. The confinement assembly comprises a right circular cylinder having portions thereof which define a plurality of separate parallel passages therethrough from an inner surface to an outer surface thereof, the passages being spaced apart in a direction normal to the direction of the gas flow through the passages. The confinement assembly being useful to be disposed between spaced-apart electrodes within the plasma processing apparatus and to neutralize the charged particles created in a radio-frequency induced discharge formed in the gaseous medium when the charged particles pass through the passages of said confinement assembly.

The invention will be better understood from the following more detailed description taken with the accompanying drawings.

The drawings are not necessarily to scale.

DETAILED DESCRIPTION

Figure 1:
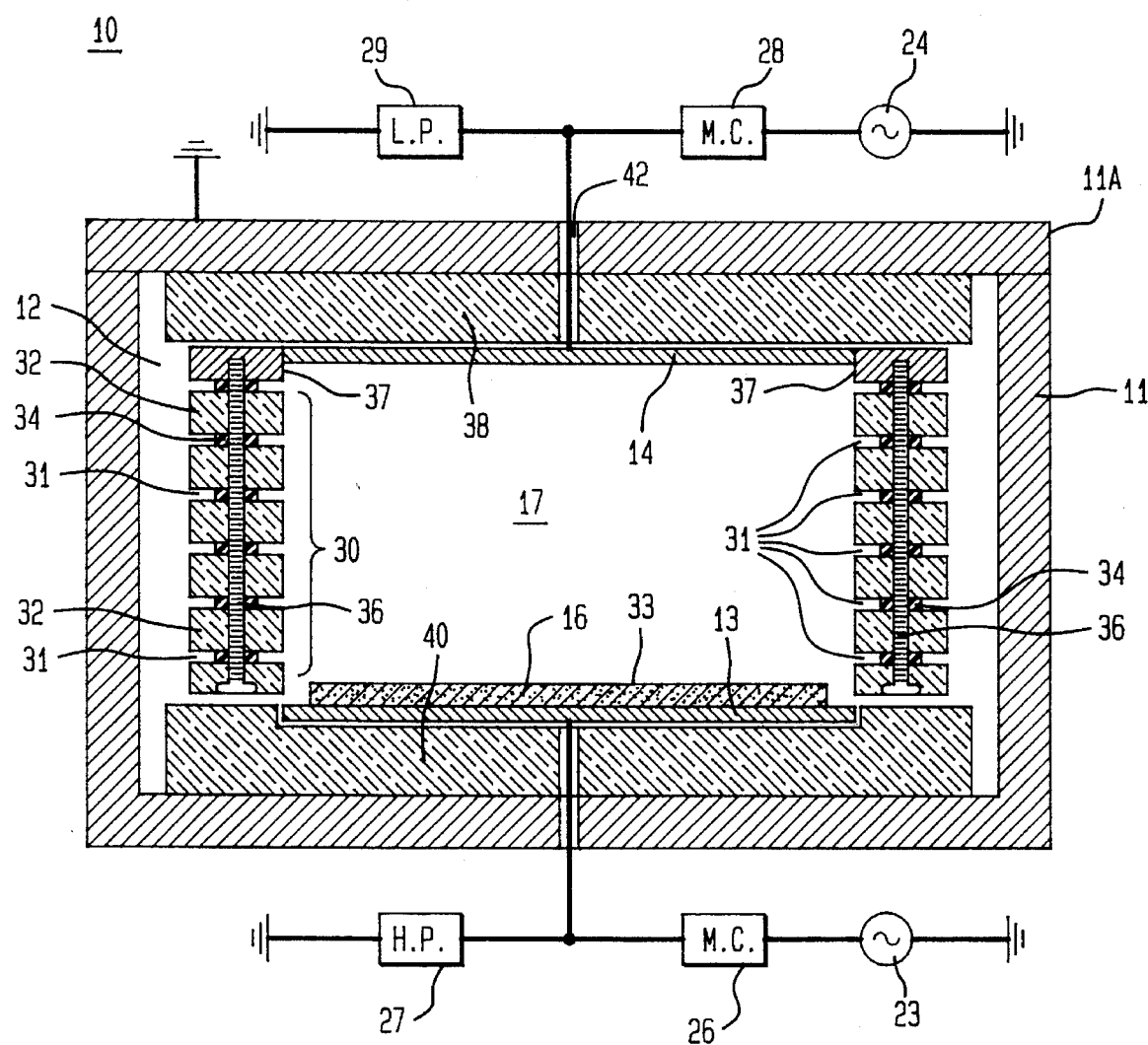
FIG. 1 shows a schematic drawing showing the basic elements of plasma etching apparatus in accordance with a preferred embodiment of the present invention.

Referring now to the FIG. 1, there is shown plasma etching apparatus 10 in accordance with a preferred embodiment of the present invention. Plasma etching apparatus may also be denoted as plasma processing apparatus and may be used for other plasma aided processing such as chemical vapor deposition (CVD). Plasma etching apparatus 10 comprises a housing 11, typically largely of a metal or of quartz, that defines a chamber 12 wherein a desired plasma etching process occurs. Housing 11 has a top portion 11a thereof which is easily removable from the rest of housing 11. Typically, the housing 11 includes at least one conductive portion that is maintained at ground potential for safety reasons. Within the chamber 12 is a pair of parallel electrodes 13 and 14, each of which is essentially planar and circular. Electrode 13 is shown supporting a workpiece 16 to be etched. Workpiece 16 is typically a semiconductor wafer 16 having an upper surface 33 typically covered with one or more layers in which vias or patterns are to be etched. Advantageously, the two electrodes 13 and 14 are of approximately equal diameter and define therebetween an interaction space 17. In operation, a gaseous medium consisting of one or more different gases is flowed into the chamber 12 by way of an inlet (not shown) to fill the interaction space 17, and spent gases are exhausted from outside the interactive space by way of an outlet (not shown). Since the particular manner of introducing and exhausting the gaseous medium that serves as the etchant is not of particular relevance to understanding the present invention, the inlet and outlets for such gaseous medium has not been shown to avoid unnecessary complexity in the drawing. A radio-frequency (r.f.) voltage that includes two different frequency components is established between the two electrodes to ionize the gas in the interaction space 17 and to form a plasma that etches the exposed surface 33 of workpiece 16 as is desired.

A first voltage source 23, which is of lower frequency than a second voltage source 24, applies its voltage to the lower electrode 13 by way of an impedance-matching circuit (MC) 26 in the usual fashion through an opening in the bottom of housing 11 and through a dielectric layer 40. It is returned to ground via upper electrode 14 by way of the low-pass filter (LP) 29. Dielectric layer 40 is typically separated from electrode 13 by a small distance so as to allow for expansion of electrode 13 during operation of apparatus 10. The second source 24 applies its voltage to the upper electrode 14 by way of impedance-matching circuit (MC) 28 through an opening 42 in housing portion 11a and through a dielectric layer 38 and it is returned to ground via lower electrode 13 by way of a high-pass filter (HP) 27. Facility is made for injection process gases in interaction space 17, typically through upper electrode 14. Dielectric layer 38 is typically separated from electrode 14 by a small distance so as to allow for expansion of electrode 14 during operation of apparatus 10. As is well known to workers in the art, in such a multifrequency design, the frequency applied by source 23 to the electrode 13 generally is used to set up a self-bias on electrode 13 that controls the energy of the ions incident on the workpiece 16 to a chosen optimal value. The frequency of the source 24 applied to the electrode 14 generally controls the density of the plasma and the quantity of ions incident on the workpiece 16. However, it is to be appreciated that higher frequency source 24 can significantly affect plasma parameters such as the sheath thickness which influences the bias imposed on the lower electrode 13. We have chosen the frequency of source 23 to be below the ion transit frequency of about 3.5 megahertz of the ions created by the discharge. By choice of a frequency in the range of about between 1.5 and 2.5 megahertz, such as 2 megahertz, which is well below the ion transit frequency, source 23 provides a boost to the energy of the ions impacting the workpiece 16, a boost that augments that provided from the self-bias created by source 23.

Moreover, we have chosen the frequency of source 24 to be 27.12 megahertz, twice the more usual frequency of 13.56 megacycles so as to better to excite the plasma with deep penetration. Preferably the confinement assembly is formed by a vertical stack of at least three rings that are separated by spacers to form a plurality of passages through the confinement assembly, each passage having a height determined by the space between the upper and lower surfaces of adjacent rings and a length determined by distance between the inner and outer edges of the rings which define the inner and outer surfaces of the assembly. Moreover, because the ratio of the two frequencies (2 and 27.12 megahertz) is more than a factor of ten, they are sufficiently different that they can be separated by simple filters. Advantageously, in the preferred embodiment, the low-pass filter 29 may be simply an inductor and the high-pass filter 27 simply a capacitor.

Various gases or mixtures of gases are known for etching, the particular choice being typically chosen to provide a desired selectivity and/or anisotropy in the etching of the various materials of the layers on the workpiece 16, as is familiar to workers in the art.

Figure 2:
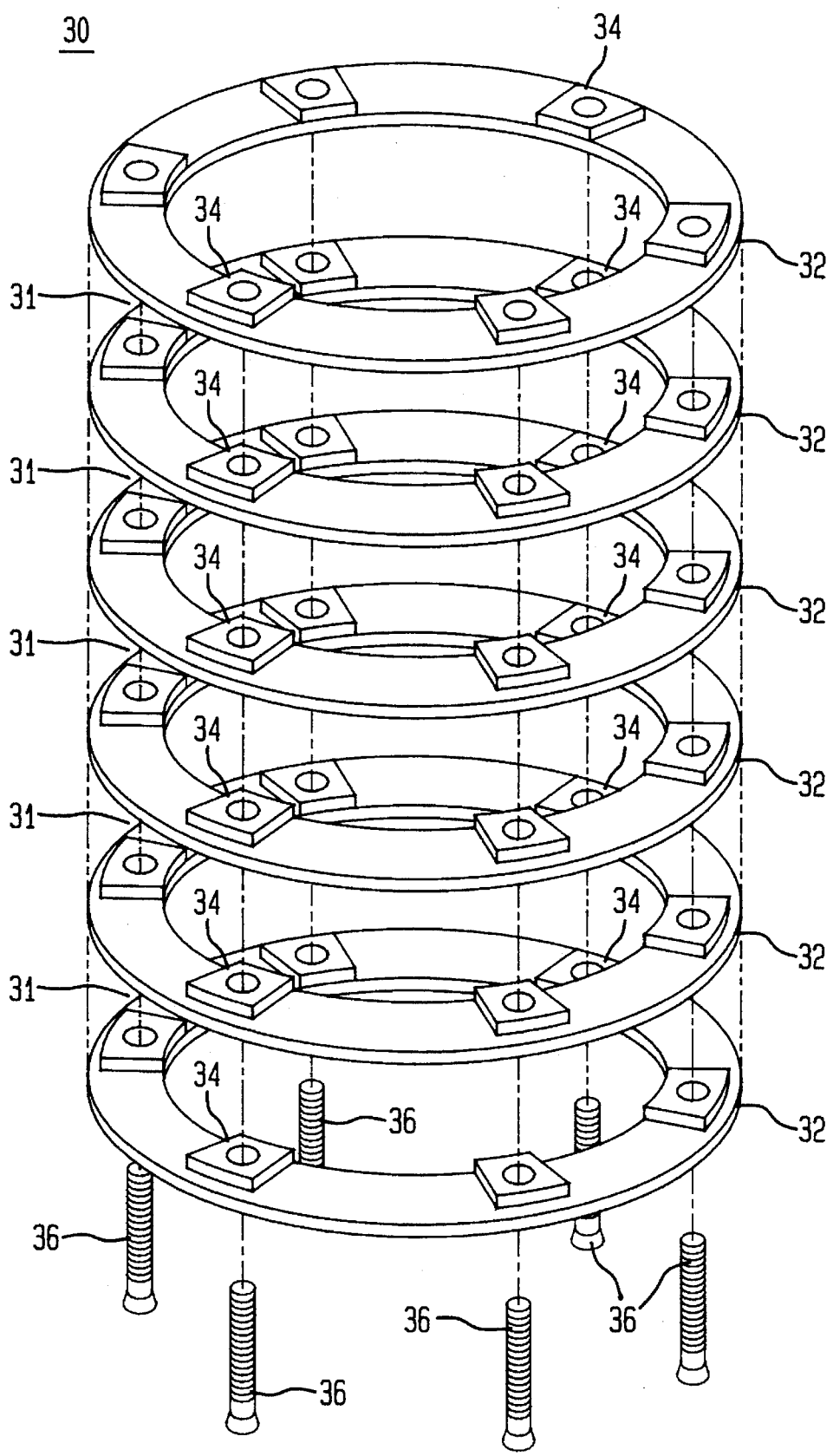
FIG. 2 shows a three dimensional view of the ring assembly of FIG. 1.

In accordance with an illustrative embodiment of the invention, during operation of apparatus 10 the plasma discharge generated between the electrodes 13 and 14 is confined to the interaction space 17 therebetween by providing a ring assembly (also denoted as a confinement assembly, a confinement shield, a stack of rings, or confinement ring) 30 which is shown in cross-section in FIG. 1 and in a three dimension view in FIG. 2.

The ring assembly 30, which serves as a slotted confinement shield, comprises a stack of circular rings 32, each of a dielectric that preferably is high quality fused silica or quartz. The stack forms a right circular cylinder. In a presently preferred embodiment six rings 32 are stacked as is shown in FIGS. 1 and 2. When assembled, the six rings 32 are separated by spacers 34 that also may be of quartz. The spacers 34 may be washers or raised regions of the rings 32. Screws 36 are threaded though the rings 32 and washers 34 to form a rigid structure. In a presently preferred embodiment screws 36 are nylon. Advantageously the assembly can be supported in the chamber 12 by threading the screws through an upper plate 37 surrounding electrodes 13 and 14 as in the apparatus shown in FIG. 1.

Spaces between adjacent rings 32 form the distinct parallel circumferential slots (passages) 31 shown in FIGS. 1 and 2 spaced apart vertically in the right circular cylinder through which the spent gases within the interaction space 17 exit for flow out of the chamber 12.

The slots 31 extend essentially around the full circumference of the ring assembly 30, being interrupted only by the spacers 34.

Each slot 31 has a minimum aspect ratio of 5:1, where the aspect ratio is defined as the ratio of the width of the slot 31 in the radial direction to the height of the slot 31 in the vertical direction. The radial width of the slot is made to be a plurality, generally at least twice and preferably at least ten times the mean-free path of the charged particles (typically an ion) that will be exiting the interaction space 17 through the slots 31. In a preferred embodiment the radial width is approximately 40 times the mean free path. The mean-free path of a particle is a function of the pressure of the gaseous medium. This dependence of mean free path on pressure causes a substantial fraction, and preferably essentially all, of such particles suffer a collision with the walls of the rings 32 that define the slots 31. Such collisions serve to neutralize charges on particles. As a result the gases exiting the confining rings are not prone to extending the plasma discharge outside the confined interaction space 17. Moreover, the ring assembly 30 acts to intercept any other foreign particles [e.g., fragments of a photoresist mask (not shown) on the surface 33 of workpiece 16] generated in the interaction space. At high flow rates there are not a sufficient number of collisions to assure that such particles will hit walls of the rings 32 before they traverse (pass through) the ring assembly 30. By having a plurality of slots 31, the gas velocity can be decreased across the ring assembly 30 so as to make it more likely that such a particle will not traverse the slot 31 without hitting the walls of the rings 32.

At the present state of the art, a typical semiconductor wafer to be processed is eight inches in diameter. For processing such a wafer, the electrodes 13 and 14 would typically each have a diameter of between about 7 and 9 inches and be spaced apart between about 1 and 1.75 inches. In a preferred embodiment for processing an eight inch semiconductor wafer 16, each ring 32 has an inner diameter of about 8.8 inches to be slightly greater than that of the wafer and an outer diameter of about 10.3 inches. There are six rings and each ring is about 90 mils thick and each slot is about 50 mils in height. There is a slot 31 between a top ring 32 of ring assembly 30 and upper plate 37. The equivalent of another slot 31 exists between a bottom ring 32 and a top surface of dielectric layer 40. According, there are effectively seven slots 31 in apparatus 10. Upper and lower surfaces of each ring 32 are essentially planar to facilitate stacking with each ring 32 having an essentially rectangular cross section. Top and bottom inner and outer edges of each ring 32 are typically slightly rounded. The spacers 34 would similarly have planar upper and lower surfaces and lateral dimensions large enough to provide the desired mechanical support for the rings 32 but small enough so as to not to seriously block the flow of gases exiting the slots 31. In one example, the gaseous medium was flowed at 400 sccm at a pressure of 50 millitorr in the chamber 12 and the mean free path calculated for gaseous particles exiting the slots was about 40 mils.

In the illustrative embodiment, the removable top portion 11a of housing 11, electrode 14, upper plate 37, and ring assembly 30 can be easily removed from the rest of apparatus 10. Once so removed, ring assembly 30 can easily be disassembled by unscrewing screws 36. This facilitates the removal of a workpiece 16, a cleaning of rings 32, and the insertion of a new workpiece 16.

It should be understood that the specific embodiment described is merely illustrations of general principles of the invention. It should be apparent that various modifications should be feasible without departing from the spirit and scope of the invention. If wordpieces, other than 8 inch semiconductive wafers are used, different dimensions of apparatus 10 would be involved. In some instances it may be desirable to use a stack of fewer or more rings 32. Alternatively, the number of slots 31 can be increased even without adding rings 32 simply by spacing the top and bottom rings 32 of the stack of rings 30 from the electrodes 13 and 14 and using the space thereby created as additional slots 31. In the limit, a single ring properly positioned to form two slots appropriately proportioned may be used. It may also be desirable in some instances to use a single-frequency design with the ring assembly 30. In such instance, a voltage signal is applied between the upper electrode 14 and the lower electrode 13, and a reference voltage (typically ground) is applied to walls defining chamber 12. In some instances, it may also be desirable to use a d-c voltage source to provide a d-c voltage on lower electrode 13.

What is claimed is:

1. Plasma processing apparatus comprising:
   means for a housing for containing a gaseous medium useful for processing a workpiece;
   a parallel pair of electrodes defining therebetween an interaction space where a plasma capable of processing a workpiece supported on one of the electrodes is generated when radio-frequency energy is provided for establishing a discharge between the electrodes and ionizing the gaseous medium; and
   a confinement assembly defining a plurality of separate parallel passages that allow gas flow through the confinement assembly from an inner surface to an outer surface, said parallel passages being spaced apart in a direction normal to that of the flow of gases through said passages, said confinement assembly being disposed between the electrodes, and said passages being proportioned for essentially confining the discharge within the interaction space by neutralizing charged particles created in the plasma when the charged particles pass through the passages.

2. The plasma processing apparatus of claim 1 wherein the confinement assembly comprises a dielectric.

3. The plasma processing apparatus of claim 1 wherein the confinement assembly comprises a right circular cylinder.

4. The plasma processing apparatus of claim 3 wherein the separate parallel passages extending through the confinement assembly are radial passages.

5. The plasma processing apparatus of claim 4 wherein the confinement assembly comprises at least one confinement ring having an upper surface and a lower surface, said at least one confinement ring being positioned so as to define a plurality of separate passages distributed circumferentially , each extending radially from said inner surface to said outer surface of the assembly in separate planes disposed between said upper and lower surfaces of the rings and substantially parallel thereto.

6. The plasma processing apparatus of claim 5 wherein the confinement assembly comprises at least three rings.

7. Plasma etching apparatus comprising:
   means for housing a gaseous medium useful for etching;
   a parallel pair of electrodes defining therebetween an interaction space where a plasma capable of etching a workpiece supported on one of the electrodes is generated when radio-frequency energy is provided for establishing a discharge between the electrodes for ionizing the gaseous medium; and
   a stack of at least three rings, which are spaced apart from each other to form slots therebetween and are positioned to surround the interaction space, for controlling the exit of spent gases and for neutralizing charged particles as they exit the interaction space so as to confine the discharge essentially to the interaction space.

8. The plasma etching apparatus of claim 7 in which each slot is proportioned such that during operation of the apparatus the distance an exiting charged particle must travel in the slot is substantially longer than its mean free path.

9. The plasma etching apparatus of claim 8 in which the rings are of a dielectric material.

10. The plasma etching apparatus of claim 9 wherein the dielectric material is quartz.

11. The plasma etching apparatus of claim 7 further comprising first and second radio-frequency voltages sources, the first source being of lower frequency than the second source and being coupled to the electrode supporting the workpiece by way of an impedance-matching circuit and to a ground return thereof by way of a low-pass filter, and the second source being coupled to the second electrode by way of a impedance-matching circuit and to a ground return thereof by way of a high-pass filter.

12. The plasma etching apparatus of claim 11 wherein the first radio-frequency source has a frequency less than the ion transit frequency characteristic of the ions to be created in the gaseous medium.

13. The plasma etching apparatus of claim 11 wherein ratio of frequencies of the first and second sources is greater than 10 to 1.

14. The plasma etching apparatus of claim 11 in which the frequency of the first source is in the range of about 1.5 to 2.5 megahertz and the frequency of the second source is in the range of about 25 to 30 megahertz.

15. The plasma etching apparatus of claim 14 wherein the frequency of the first source is about 2.0 megahertz and the frequency of the second source is about 27.12 megahertz.

16. The plasma etching apparatus of claim 15 in which the rings are of a dielectric material.

17. The plasma etching apparatus of claim 16 wherein the dielectric material is quartz.

18. Plasma etching apparatus comprising:

means for housing a gaseous medium useful for etching;

a parallel pair of electrodes defining therebetween an interaction space where a plasma capable of etching a workpiece supported on the first of the electrodes is generated when radio-frequency energy is provided for establishing a discharge between the electrodes for ionizing the gaseous medium to form ions characterized by an ion transit frequency;

a first radio-frequency voltage source having a frequency less than the ion transit frequency;

a second radio-frequency voltage source having a frequency at least greater than ten times the first frequency;

the first source being coupled to the first electrode by way of an impedance-matching circuit and to a ground return thereof by way of a low-pass filter; and the second radio-frequency voltage source being coupled to the second electrode by way of a matching circuit and to a ground return thereof by way of a high-pass filter.

19. The plasma etching apparatus of claim 18 wherein the frequency of the first and second radio-frequency voltage sources are about 2.0 and 27.12 megahertz, respectively.

20. Plasma etching apparatus comprising:

means for housing a gaseous medium useful for etching;

a parallel pair of electrodes defining therebetween an interaction space where a plasma capable of etching a workpiece supported on one of the electrodes is generated when radio-frequency energy is provided for establishing a discharge between the electrodes for ionizing the gaseous medium;

a stack of at least three rings, which are spaced apart from each other to form slots therebetween and are positioned to surround the interaction space, for controlling the exit of spent gases and for neutralizing charged particles as they exit the interaction space and thereby for confining the discharge essentially to the interaction space.

a first radio-frequency voltage source having a frequency in the range of about 1.5 to 2.5 megahertz;

a second radio-frequency voltage source having a frequency in the range of about 25 to 30 megahertz;

the first source being coupled to the first electrode by way of an impedance-matching circuit and to a ground return thereof by way of a low-pass filter; and the second radio-frequency voltage source being coupled to the second electrode by way of an impedance-matching circuit and to a ground return thereof by way of a high-pass filter.

21. The plasma etching apparatus of claim 20 in which each slot is proportioned such that during operation of the apparatus the distance an exiting charged particle must travel in the slot is substantially longer than its mean free path.

22. The plasma etching apparatus of claim 21 wherein the frequency of the first and second radio-frequency voltage sources are about 2.0 and 27.12 megahertz, respectively.

23. The plasma etching apparatus of claim 22 in which the rings are of a dielectric material.

24. The plasma etching apparatus of claim 23 wherein the dielectric material is quartz.

25. The plasma etching apparatus of claim 20 wherein the stack of rings comprises six rings and define five slots therebetween and an upper and a lower slot.

26. A confinement assembly for essentially confining a discharge within an interaction space of a plasma processing apparatus containing a gaseous medium useful for processing, said confinement assembly comprising:

a right circular cylinder having portions thereof which define a plurality of separate parallel passages therethrough from an inner surface to an outer surface thereof, the passages being spaced apart in a direction normal to the direction of the gas flow through the passages;

said confinement assembly being useful to be disposed between spaced-apart electrodes within the plasma processing apparatus and to neutralize charged particles created in a radio-frequency induced discharge formed in the gaseous medium when said charged particles pass through the passages of said confinement assembly.

27. The confinement assembly of claim 26 wherein the cylinder comprises a dielectric.

28. The confinement assembly of claim 26 wherein the passages through the confinement assembly comprise radially extending passages.

29. The confinement assembly of claim 28 wherein the confinement assembly comprises at least one confinement ring having an upper surface and a lower surface, said at least one confinement ring being positioned to define a plurality of slots distributed circumferentially therein and extending radially from said inner surface to said outer surface in a plane disposed between said upper and lower surfaces substantially parallel thereto.

30. The confinement assembly of claim 29 wherein there are at least three confinement rings.

* * * * *